United States Patent [19]

Nakano et al.

[11] Patent Number: 4,857,671

[45] Date of Patent: Aug. 15, 1989

[54] FILM CARRIER AND BONDING METHOD USING THE FILM CARRIER

[75] Inventors: Hirotaka Nakano, Yokohama; Thunekazu Yoshino, Kamakura, both of Japan

[73] Assignee: Kabushiki Kaisha Toshiba, Kawasaki, Japan

[21] Appl. No.: 260,472

[22] Filed: Oct. 17, 1988

Related U.S. Application Data

[62] Division of Ser. No. 101,245, Sep. 25, 1987.

[30] Foreign Application Priority Data

Sep. 25, 1986 [JP] Japan ............................. 61-224764
Oct. 16, 1986 [JP] Japan ............................. 61-244164
Oct. 30, 1986 [JP] Japan ............................. 61-256823

[51] Int. Cl.$^4$ .................................................. H05K 1/00
[52] U.S. Cl. ......................................... 174/68.5; 29/840; 228/180.2
[58] Field of Search ................... 174/68.5; 228/180.2, 228/179; 29/840

[56] References Cited

U.S. PATENT DOCUMENTS

| | | | |
|---|---|---|---|
| 3,031,747 | 5/1962 | Green | 228/123 |
| 3,544,857 | 12/1970 | Byrne et al. | 357/70 |
| 3,646,670 | 3/1972 | Maeda | 228/180.2 X |
| 3,651,562 | 3/1972 | Hambleton | 29/832 X |
| 3,680,198 | 8/1972 | Wood | 228/180.2 X |
| 3,744,121 | 7/1973 | Nagano et al. | 228/123 |
| 3,781,596 | 12/1973 | Galli et al. | 174/68.5 X |
| 3,811,186 | 5/1974 | Larnerd et al. | 174/68.5 X |
| 3,832,769 | 9/1974 | Olyphant, Jr. et al. | 174/68.5 X |
| 3,968,075 | 9/1975 | Jackson et al. | 174/68.5 X |
| 3,986,255 | 12/1976 | Mandal | 228/124 |
| 4,110,783 | 8/1978 | Onodera et al. | 357/67 |
| 4,142,662 | 3/1979 | Holbrook et al. | 228/110 |
| 4,332,341 | 6/1983 | Minetti | 228/193 X |
| 4,442,966 | 4/1984 | Jourdain et al. | 228/180.2 X |
| 4,545,610 | 10/1985 | Lakritz et al. | 228/180.2 X |
| 4,666,078 | 5/1987 | Ohno | 228/124 |

FOREIGN PATENT DOCUMENTS

| | | |
|---|---|---|
| 0103025 | 2/1983 | European Pat. Off. |
| 2104625 | 2/1972 | Fed. Rep. of Germany. |
| 3305952 | 8/1984 | Fed. Rep. of Germany ... 228/180.2 |
| 33480 | 3/1977 | Japan. |
| 152147 | 9/1982 | Japan. |
| 1199502 | 12/1985 | U.S.S.R. ............................. 228/179 |
| 1371738 | 10/1974 | United Kingdom. |
| 1527108 | 12/1978 | United Kingdom. |
| 2025129 | 6/1979 | United Kingdom. |
| WO82/02457 | 7/1982 | World Int. Prop. O. |

OTHER PUBLICATIONS

Grossman, S. E.; Film-Carrier Technique Automates the Packaging of IC Chips; Electronics-Technical Articles; 5/16/74; pp. 89–95.

Primary Examiner—Morris H. Nimmo
Attorney, Agent, or Firm—Cushman, Darby & Cushman

[57] ABSTRACT

A film carrier according to this invention comprises a base film, a plurality of conductors formed on the base film, and a plurality of layers formed on the conductors, each being made of a low-melting point bonding metal. A bonding method of this invention comprises the steps of aligning the bonding metal layers of the film carrier with the terminals of an electronic part, and half-melting the bonding metal layers by thermocompression, thereby to electrically connect the conductors of the film carrier to the terminals of the electronic part. The object of the present invention is to provide a film carrier which can serve to connect electronic parts to a circuit by means of a low pressure and at a low temperature, without causing damage to the electronic parts such as semiconductor elements, and also a bonding method using this film carrier.

2 Claims, 6 Drawing Sheets

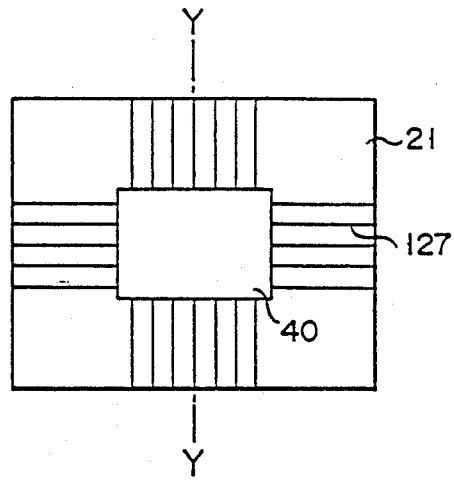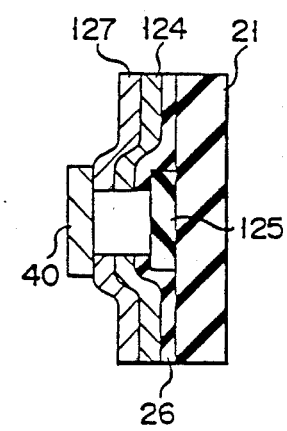
FIG. 3A  FIG. 3B
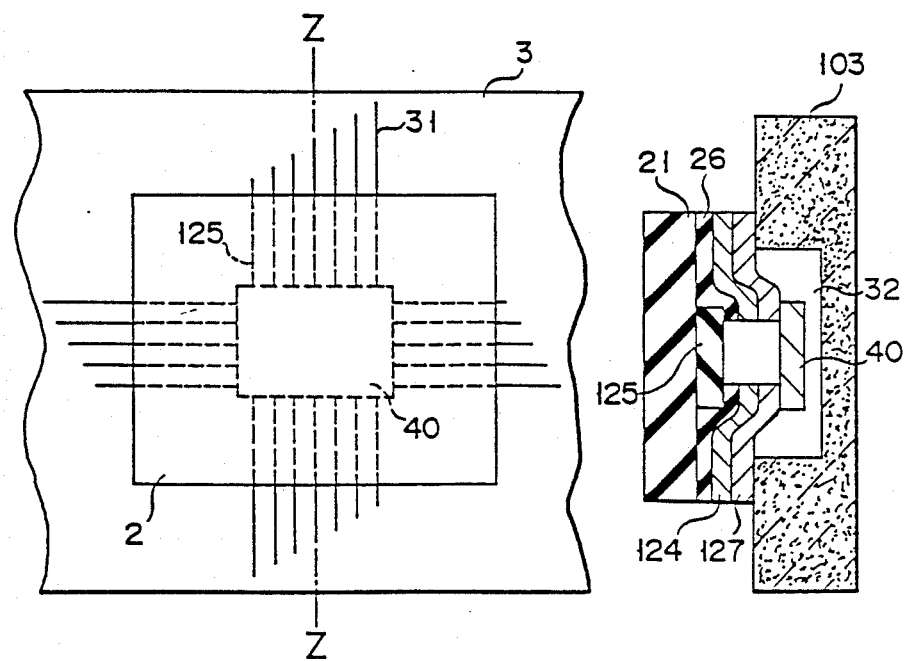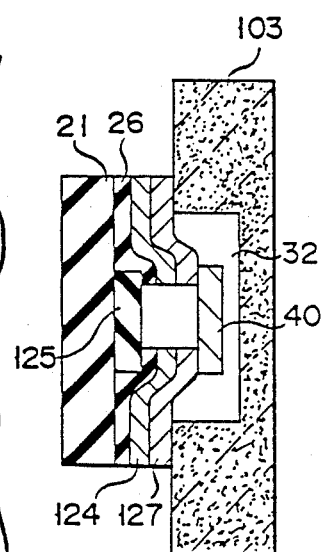
FIG. 4A  FIG. 4B

FILM CARRIER AND BONDING METHOD USING THE FILM CARRIER

This application is a divisional application of U.S. application Serial No. 07/101,245 filed Sept. 25, 1987, now U.S. Patent No. 4,808,769.

The following applications are related to this application: U.S. application Serial No. 07/089,989 filed Aug. 27, 1987 and U.S. application Serial No. 07/100,278 filed Sept. 23, 1987.

BACKGROUND OF THE INVENTION

The present invention relates to a film carrier for simultaneously connecting external leads to the electrodes of electronic parts such as semiconductor elements, and also to a bonding method using this film carrier.

Recent times have seen the manufacture of semiconductor integrated circuits of increasing integration density, as a result of the progress made in improving the manufacturing techniques. This has made it possible to manufacture integrated circuits each of which now has more than 100 terminals. Progress in manufacturing has, not surprisingly, been accompanied by the demand for the development of a highly efficient technique for bonding the terminals of these highly integrated circuits to a circuit board. The so-called film carrier, which can help to bond the numerous terminals of a semiconductor integrated circuit element, at a time, to a circuit board, is now attracting much attention.

The film carrier comprises a base film made of resin, on which cooper conductors are formed. While being pressed onto the terminals of the semiconductor element, the copper conductors are fused to the terminals of a semiconductor element. More specifically, bumps made of a lamination of titanium, nickel, palladium, and gold are formed on the aluminum terminals of the semiconductor element, and tin layers are deposited on the copper conductors formed on the base film. Both the bumps and the tin layers are heated to a high temperature ranging from 450° to 500° C., and the conductors are pressed onto the aluminum terminals, with a high pressure ranging from 200 to 1000 kg/cm$^2$ (20 to 100 g for one 100 $\mu$m $\times$ 100 $\mu$m terminal), thereby forming a gold-tin eutectic alloy. This eutectic alloy bonds the conductors to the terminals of the semiconductor element.

Among the various known bonding methods using film carriers is the tape automated bonding method, which is disclosed in Japanese Patent Disclosure Sho 57-152147. Using this method, gold bumps are transferred onto tin layers on the copper of a film carrier, and these leads are fused to the aluminum terminals of a semiconductor element, while being pressed onto the terminals.

The conventional bonding methods using a film carrier, however, have drawbacks.

Since the leads are heated to a high temperature and pressed onto the terminals of the semiconductor element with a high pressure, there is the possibility that the semiconductor element will be damaged. Further, when the conventional method is used when manufacturing color liquid-crystal displays (e.g., a SiTFT displays), the organic color filters used in the displays will be heated to a temperature over their maximum operating temperature of 150° C., while the leads of the film carrier and the terminals of the semiconductor elements used in the displays are being heated to the abovementioned high temperature and high pressure. Consequently, this will result in the degradation of the color filters.

When the bonding method using a film carrier is used to bond the outer leads, such as the drive-signal terminals of a liquid-crystal device, these terminals and the leads of the film carrier are plated with a solder alloy, and the plated solder alloy is melted. The plated layers of the solder alloy may exfoliate from the terminals and the leads, or may develop cracks, when they are cooled from the high bonding temperature to room temperature, due to the terminal strain resulting from the difference in the respective thermal expansion coefficients of the terminals of the liquid-crystal device, the terminals being mounted on a glass plate, and the leads of the film carrier on which the device is mounted.

The more terminals the semiconductor element has, the more difficult it is to make them of the same height. In most cases, some terminals will be taller than others. Consequently, when the leads of a film carrier are pressed onto the bumps formed on the terminals of a semiconductor element, the pressure is concentratedly applied on the taller terminals. This may cause damage to the semiconductor element.

When tape automated bonding method is employed, the film carrier must be aligned with the substrate in order to transfer the bumps onto the leads of the film carrier. Thereafter, the film carrier with the transferred bumps must be aligned with an outer terminal. In other words, two alignment apparatuses are required, in order to perform tape automated bonding. Since an alignment apparatus is very expensive, the tape automated bonding method is, therefore, uneconomical.

SUMMARY OF THE INVENTION

The object of the present invention is to provide a film carrier which can serve to connect electronic parts to a circuit by use of a low pressure and at a low temperature, without causing damage to the electronic parts such as semiconductor elements, and also to provide a bonding method using this film carrier.

A film carrier according to this invention comprises a base film, a plurality of conductors formed on the base film, and a plurality of layers formed on the conductors, each being made of a low-melting point bonding metal. A bonding method of this invention comprises the steps of aligning the bonding metal layers of the film carrier with the terminals of an electronic part, and half-melting the bonding metal layers by thermocompression, thereby electrically connecting the conductors of the film carrier to the terminals of the electronic part.

BRIEF DESCRIPTION OF THE DRAWINGS

FIGS. 3A and 3B are a plan view and a sectional view of that portion of the film carrier which has been cut for bonding outer leads;

FIGS. 4A and 4B are a plan view and a sectional view of a printed circuit board, with the portion of the film carrier bonded to the board;

DETAILED DESCRIPTION OF THE INVENTION

Figure 1A:
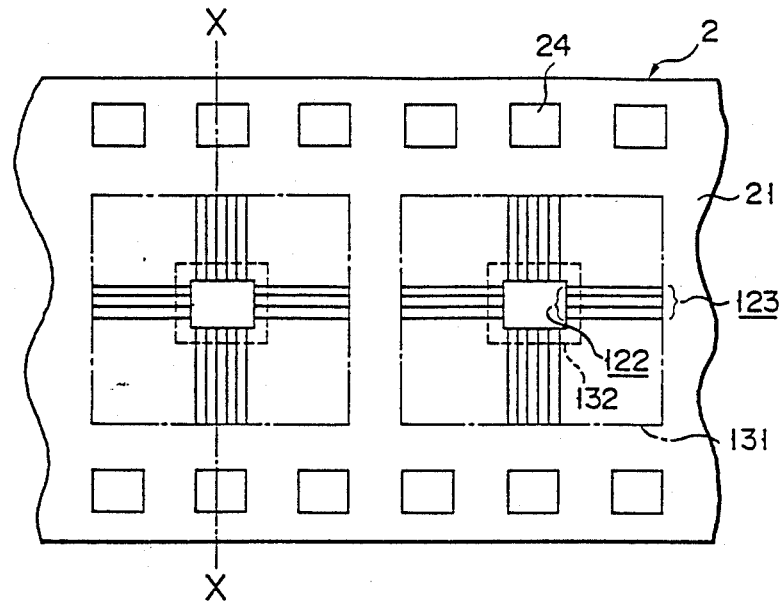
FIGS. 1A and 1B are a plan view and a sectional view of a film carrier according to one embodiment of the present invention.

A film carrier according to the invention comprises a base film, conductors formed on the base film, and layers of a low-melting point bonding metal, which are formed on the conductors. The film carrier is mounted on an electronic part, with the metal layers put in contact with the terminals of the electronic part. The metal layers are heated to a relatively low temperature and thus half-melted, and then pressed onto the terminals of the electronic part. Therefore, the numerous terminals can be bonded at a time. Hence, only one alignment apparatus suffices to bond the terminals of the electronic part.

Preferably, the base film has a thickness of 50 to 150 $\mu$m, in particular 100 to 130 $\mu$m in view of the required mechanical strength of the base film (i.e., the resistance to twisting and bending). On the base film, inner-lead sections and outer-lead sections are arranged at predetermined intervals. These lead sections are formed in the following way. Conductors, (usually copper foils) are bonded to the base film by means of an adhesive. Layers of a low-melting point bonding metal are bonded while being pressed onto the conductors. The metal layers are usually foils having a thickness of 50 to 150 $\mu$m. The metal layers are etched, and the conductors are then etched, thereby forming the inner-lead sections and the outer-lead sections. As a result, the film carrier is made.

The low-melting point metal can be any alloy, preferably low-melting point adherent alloy, that can be bonded by thermocompression. Needless to say, the lower the melting point, the better. The low-melting point adherent alloy is a combination of a low-melting point solder alloy and an element which promotes the bonding at the interface between the alloy layers and the terminals of a semiconductor element. The solder alloy is a solder, such as Pb-Sn alloy or Sn-Zn alloy, made of two more metals selected from the group consisting of Pb, Sn, Zn, Cd and Bi, and contains In or another portion of Bi or Cd, in particular In, which lowers the melting point of the solder. Sb can be used as the element for promoting the bonding at the interface between the alloy layers and the terminals of the semiconductor element, or the terminals of a conductor. An element, such as Zn, Al, Ti, Si, Cr, Be or a rate earth element, which has affinity with oxygen, can be added to Sb, thereby further promoting the bonding. The element which promotes the bonding can contain other impurities as long as these impurities do not greatly reduce the bonding ability of the alloy layers which characterize the present invention.

The low-melting point adherent alloy can be strongly bonded to glass, too, when an ultrasonic power is applied to it while it is in a molten condition. Moreover, it can be firmly bonded by thermocompression in a half-molten state to glass, other oxides, and a metal such as Mo, Cr or Ta which can hardly be wetted with a Pb-Sn solder. Therefore, it can be easily bonded to metal oxides known as transparent electrode materials, such as $SnO_2$, $In_2O_3$, and ITO (Indium Tin Oxide). The bonding mechanism of this alloy can be proved by the chemical bonding of (alloy)-(additive)-O-(oxide, etc.).

Generally, the terminals of semiconductor elements are made of aluminum. The surfaces of these aluminum terminals undergo natural oxidation, thus forming $Al_2O_3$ layers, which are the prominent cause of an insufficient bonding between the terminals and the conductors. Nonetheless, the film carrier of this invention can bond the terminals to the conductors since the metal layers formed on the conductors has strong affinity with oxygen, even if the surface regions of the terminals are made of $Al_2O_3$. Hence, when the film carrier is used, the aluminum terminals can be bonded to the conductor board, without being surface-treated (e.g., deposition of a bonding metal). The film carrier of this invention can, therefore, facilitate the manufacture of apparatuses having integrated circuits.

By using Pb, Sn, Zn, Sn and the like in an appropriate combination, the bonding metal can have a softening point of about 165° C. and a melting point of 195° C. The present invention utilized the plastic deformation of the bonding alloy in a half-molten state to bond the terminals of a semiconductor element to the conductors of the film carrier. When this metal is heated above its melting point, it will flow, possibly short-circuiting the adjacent terminals of the semiconductor element. A strict temperature control must therefore be made in bonding the terminals to the conductors of the film carrier.

In the present invention, the bonding metal is in a half-molten condition during the terminal-to-conductor bonding. It can be plastically deformed with a low pressure. Since no high pressure is required for the bonding, there is no possibility of damaging the semiconductor element. In addition, since the bonding metal can be half-melted at a relatively low temperature, there is little difference in temperature when cooled to room temperature, and the metal layers have no cracks after the terminal-to-conductor bonding. Therefore, the film carrier of this invention is suitable for use in bonding a semiconductor IC drive device to a liquid-crystal display having organic color filters. When this IC drive device is bonded to a transparent circuit board, it must have transparent terminals made of $SnO_2$, $In_2O_3$, or ITO.

Furthermore, since the bonding metal is in a half-molten condition when the conductors of the film carrier are pressed onto the terminals of the semiconductor element, the terminals can be connected to the conductors even if the terminals have different heights, and the gaps between the terminals, on the one hand, and the conductors, on the other hand, are not equal.

DETAILED DESCRIPTION OF THE PREFERRED EMBODIMENTS

Example 1

FIG. 1A is a plan view of a film carrier according to the invention. As is shown in this figure, the film carrier 2 comprises base film 21 made of polyamide resin tape, and an inner-lead section 122 formed on base film 21, and an outer-lead section 123 also formed on base film 21. Sprocket holes 24 are cut in both longitudinal edges of base film 21. Inner-lead section 122 is to be connected to a semiconductor element. Outer-lead section 123 is to be connected to the external terminals of the electronic component. In FIG. 1A, square 131 represents the region where the semiconductor element will be located, and square 132 shows that portion of film carrier 2 which will be cut off in order to perform outer-lead bonding. The polyamide resin can remain intact when heated up to about 160° C.

Figure 1B:
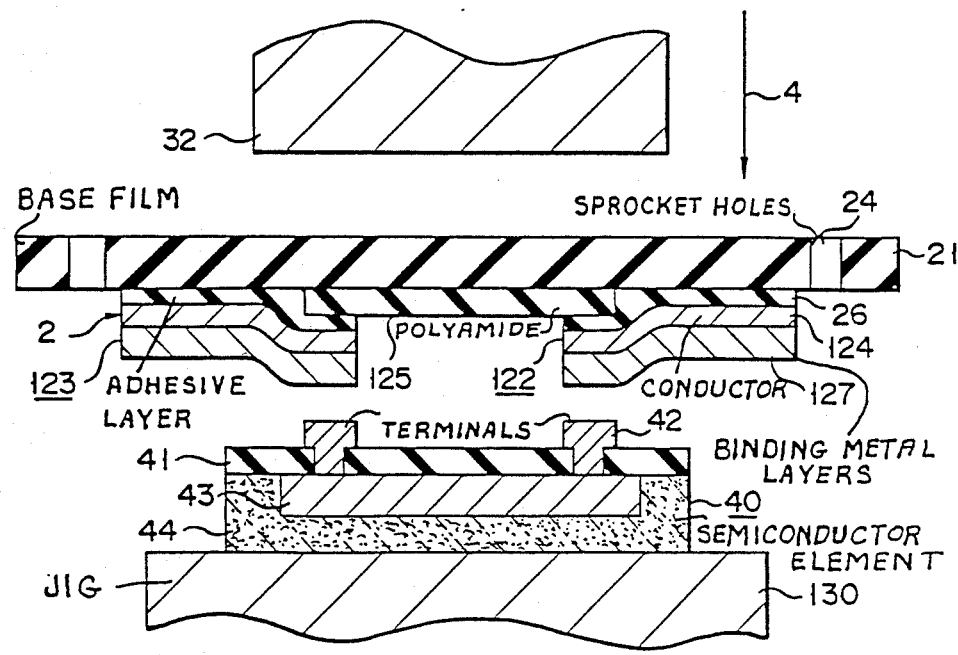

FIG. 1B is a sectional view, taken along line X—X in FIG. 1A. Square sheet 125 of polyamide region, having a thickness of 35 μm, is adhered to base film 21, thus forming inner-lead section 122 projecting from base film 21. Inner-lead section 122 can be formed by pressing and deforming base film 21. Conductors 124 (i.e., copper strips), extending parallel, are connected to sheet 125 by adhesive layer 26. Bonding metal layers 127 made of a low-melting point metal are bonded to conductors 124 by thermocompression.

Conductors 124 and bonding metal layers 127 are formed by adhering a foil of the bonding metal to a foil of copper, and then photo-engraving the bonding metal foil, thus forming strips, and finally photo-engraving the upper foil, thereby forming conductors 124.

The bonding metal is a low-melting point adherent alloy consisting of 20% by weight of Pb, 66% by weight of Sn, 10% by weight of In, 2% by weight of Sb, and 2% by weight of Zn. This alloy has a softening point of 134° C. and a melting point of 160° C. Therefore, the conductors were bonded to the terminals of the semiconductor element at 150° C.

Adherent alloy layers 127 can be easily formed by etching the foil of the above-mentioned alloy, with hydrochloric acid or the like. In order to protect copper conductors, a foil of an inert metal such as Cr, Mo or Ti can be interposed between the copper foil and the adherent alloy foil. Cr, Mo and Ti can strongly bond the copper foil and the bonding alloy foil.

In order to prevent copper conductors 124, made by etching selected portions of the copper foil, from being oxidized, conductors 124 can be plated with Sn or Au layers having a thickness of 0.05 to 2 μm. Since Sn or Au is thermally diffused into bonding metal layers 127 when conductors 124 are pressed onto the terminals of a semiconductor element, neither Sn nor Au layers adversely influences the electrical connection of conductors 12 to the terminals of the semiconductor element.

No metal layers for preventing the oxidation of bonding metal layers 127 need be formed on layers 127 if the oxide layers are removed from layers 127 immediately before copper conductors 124 are bonded to the terminals of a semiconductor element. In order to remove the oxide layers from metal layers 127, it suffices to etch layers 127 with diluted hydrochloric acid, rinsing film carrier 2 with pure water, and drying film carrier 2 by means of $N_2$ blowing.

It will now be explained how to bond inner-lead section 122 to the terminals of a semiconductor element. As is shown in FIG. 1B, a plurality of aluminum terminals 42 is formed on oxide layer 41 which in turn is formed on substrate 44 of semiconductor element 40. Function circuit 43 is formed in the surface of substrate 44 and covered with oxide layer 41. Aluminum terminals 42 are electrically connected to this function circuit 43. To bond bonding metal layers 127 of film carrier 2 to terminals 42 of semiconductor element 40, layers 127 are aligned with terminals 42, respectively. Then, tool 32 is moved down in the direction of arrow 4, thereby pressing film carrier 2 onto semiconductor element 40 with a pressure of 1 to 10 g for each 100 μm × 100 μm terminal 42, while bonding metal layers 127 are being heated to 150° C., as is illustrated in FIG. 2A.

Figure 2B:
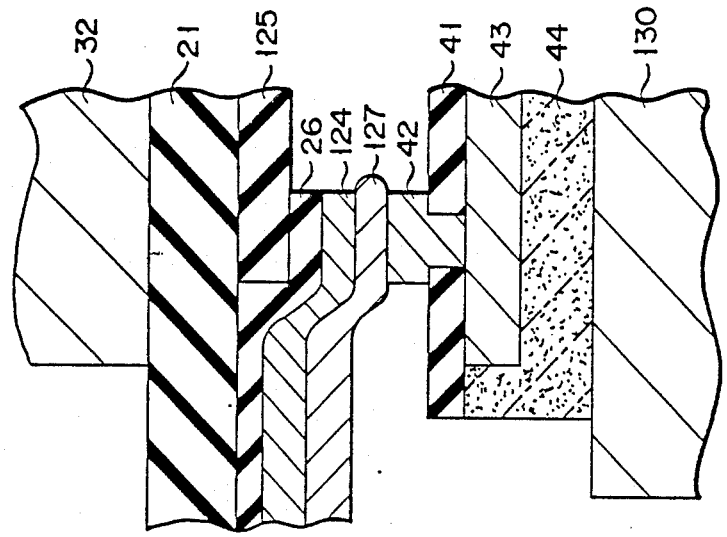
FIGS. 2A and 2B are enlarged views showing two portions of the film carrier and a semiconductor element which undergo the bonding method according to the present invention.
Figure 2A:
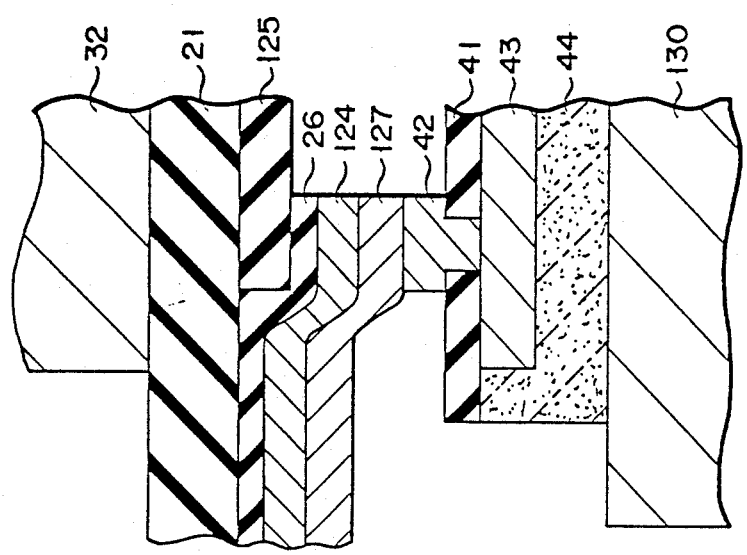

As is shown in FIG. 2A, semiconductor element 40 is held on jig 130. This jig 130 is heated to 100° to 120° C. The heat is transmitted from jig 130 to bonding metal layers 127 through substrate 44 and terminals 42, whereby bonding metal layers 127 are heated. Therefore, the temperature of layers 127 rises to 145° to 155° C. within a few seconds when the heater (not shown) provided within tool 32 is turned on. When bonding metal layers 127 are heated to 145° to 155° C., the heater is turned off. Then, layers 127 are cooled to a temperature below the softening point (134° C.) of the bonding alloy, while maintaining layers 127 pressed onto terminals 42 with a pressure of 10 to 100 kg/cm². Thereafter, tool 32 is lifted from film carrier 2. In the case where Au or Sn layers are plated on bonding metal layers 127, these plated layers are diffused into layers 127 while layers 127 are being bonded to terminals 42 of the semiconductor element.

As is illustrated in FIG. 2B, that portion of each bonding metal layer 127, which is interposed between terminal 42 and that portion of copper conductor 124 which is located below sheet 125, undergoes elastic deformation. Conductors 124 can thus be bonded to terminals 42 at a relatively low temperature under a relatively low pressure.

In order to use the film carrier of this invention in outer bonding, each portion of the film carrier, to which a semiconductor element has been inner-bonded, is cut out. Then, if necessary, the outer-lead section of this carrier portion is trimmed, and the terminals of the semiconductor element are also trimmed; that is, so-called "lead forming" is carried out.

FIG. 3A is a plan view of one portion of the film carrier, with one semiconductor element bonded to it. FIG. 3B is a sectional view taken along line Y—Y in FIG. 3A.

The outer-lead bonding is performed using the same steps as in the inner-lead bonding. As is shown in FIG. 4A, conductors 31 are formed on printed circuit board 3. Conductors 124 formed on outer-lead section 123 of film carrier 2 are aligned with these conductors 31, and then are bonded to conductors 31 by thermocompression. FIG. 4B is a sectional view taken along line Z—Z in FIG. 4A. As this figure clearly shows, semiconductor element 40 is provided in recess 32 cut in printed circuit board 3.

In order to protect the connection between the terminals of semiconductor element 40 and the conductors 124 of film carrier 2, and also to enhance the durability of the film carrier, film carrier 2 can be covered with a coating or a film of, for example, polyester, except for inner-lead section 122 and outer-lead section 123. It suffices if this coating or film has a thickness of 20 to 50 μm.

The conductors formed on base film 21 can be made of the low-melting point bonding metal. If this is the case, the bonding metal layers are formed directly on base film 21.

Example 2

Figure 5A:
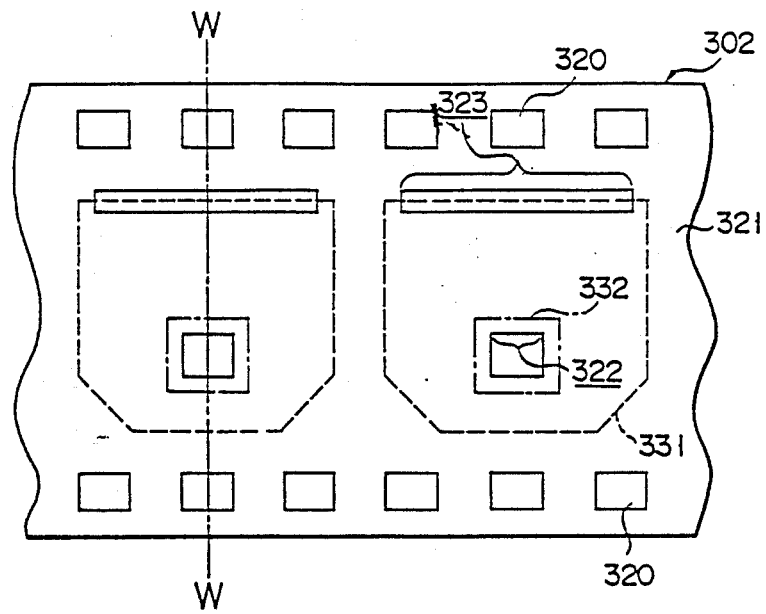
FIGS. 5A and 5D are views of a film carrier according to one embodiment of the present invention.

FIG. 5A is a plan view of a film carrier according to the invention. As is shown in this figure, the film carrier 302 comprises base film 321 made of polyimide resin tape, and an inner-lead section 322 cut inside base film 321, and an outer-lead section 323 also cut inside base film 321. Sprocket holes 320 are cut in both longitudinal edges of base film 321. Inner-lead section 322 is to be connected to a semiconductor element. Outer-lead section 323 is to be connected to the external terminals of the driving circuit in the liquid crystal display device. In FIG. 5A, square 331 represents the region where the semiconductor element will be located, and hexagon 332 shows that portion of film carrier 320 which will be cut off in order to perform outer-lead bonding. The polyamide resin can remain intact when heated up to about 160° C.

Figure 5B:
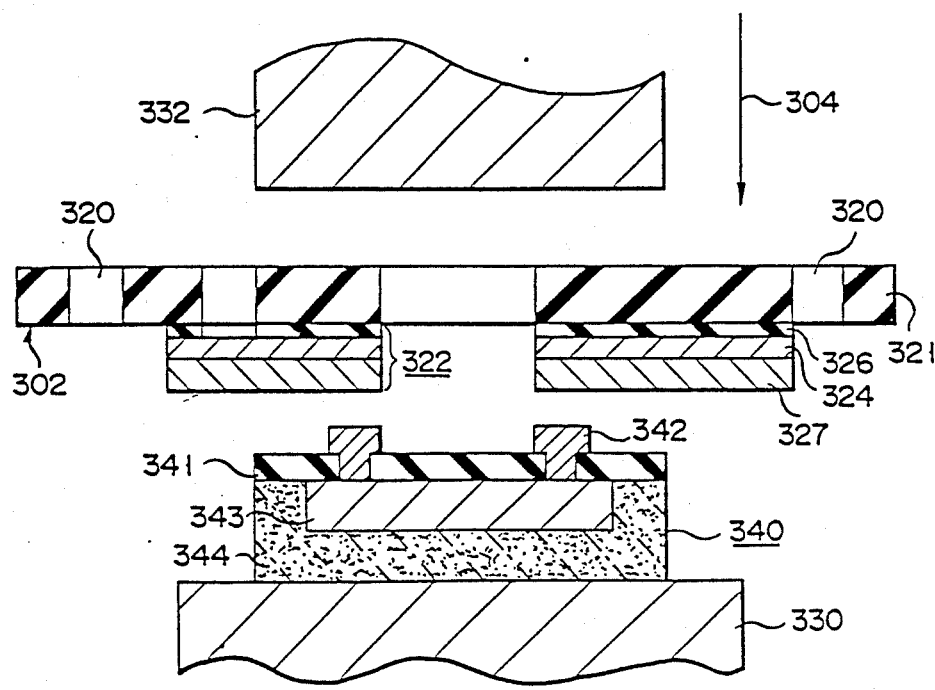

FIG. 5B is a sectional view, taken along line W—W in FIG. 5A. Conductors 324 (i.e., copper strips) are connected to base film 321 by adhesive layer 326. Bonding metal layers 327 made of a low-melting point metal are bonded to conductors 324 by thermocompression.

Conductors 324 and bonding metal layers 327 are formed by adhering a foil of the bonding metal to a foil of copper, and then photo-engraving the bonding metal foil, thus forming strips, and finally photo-engraving the upper foil, thereby forming conductors 324.

The bonding metal of this Example was the same as that of Example 1.

It will now be explained how to bond inner-lead section 322 to the terminals of a semiconductor element. As is shown in FIG. 5B, a plurality of aluminum terminals 342 is formed on oxide layer 341 which in turn is formed on substrate 344 of semiconductor element 340. Function circuit 343 is formed in the surface of substrate 344 and covered with oxide layer 341. Aluminum terminals 342 are electrically connected to this function circuit 343. To bond bonding metal layers 327 of film carrier 302 to terminals 342 of semiconductor element 340, layers 327 are aligned with terminals 342, respectively. Then, tool 332 is moved down in the direction of arrow 304, thereby pressing film carrier 302 onto semiconductor element 340 with a pressure of 1 to 10 g for each 100 $\mu m \times 100$ $\mu m$ terminal 342, while bonding metal layers 372 are being heated to 150° C.

In order to use the film carrier of this invention in outer bonding, each portion of the film carrier, to which a semiconductor element has been inner-bonded, is cut out. Then, if necessary, the outer-lead section of this carrier portion is trimmed, and the terminals of the semiconductor element are also trimmed; that is, so-called "lead forming" is carried out.

Figure 5C:
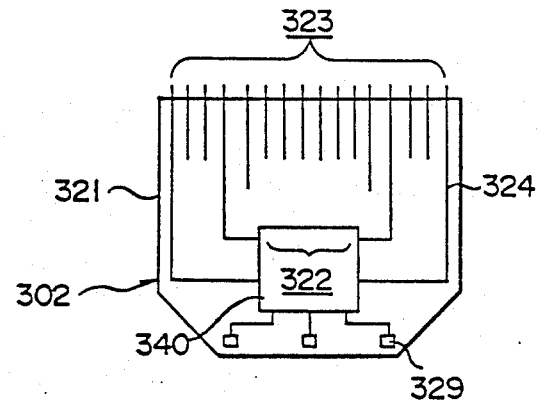

FIG. 5C is a plan view of one portion of the film carrier, with one semiconductor element bonded to it.

Figure 5D:
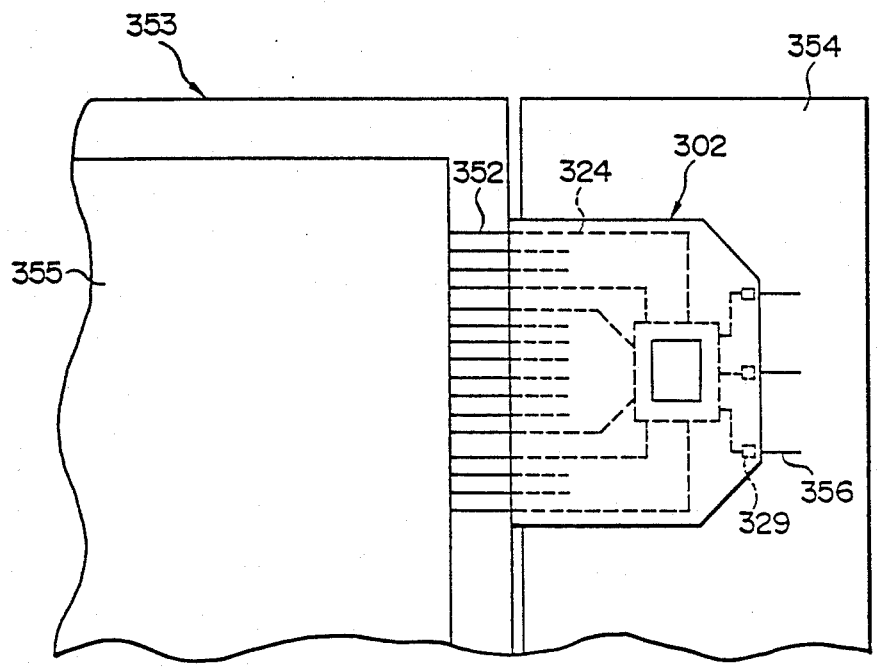

The outer-lead bonding is performed in the same steps as in the inner-lead bonding. As is shown in FIG. 5D, conductors 324 are connected to the conductors 352 arrayed on liquid crystal display device 353 having display portion 355. Conductors 324 formed on outer-lead section 323 of film carrier 302 are aligned with these conductors 352, and then are bonded to conductors 352 by thermocompression.

Input terminal of semiconductor device 329 is bonded to wiring 356 on glass-epoxy board 354.

Example 3

Figures 6A, 6B:
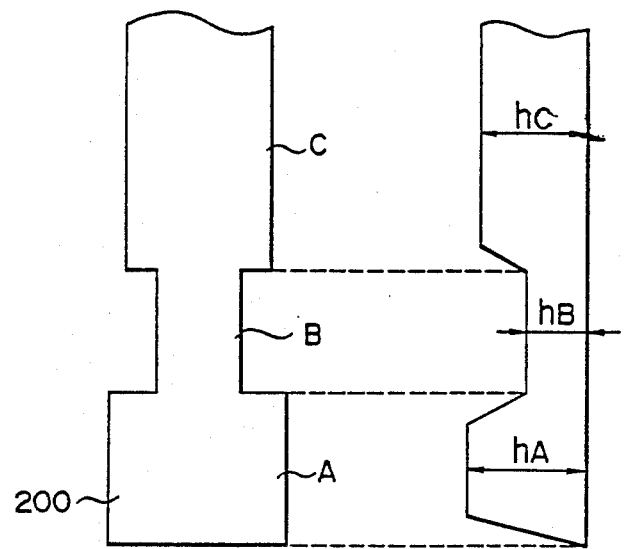
FIGS. 6A to 6D are plan views and sectional views of two types of conductors of the film carrier according to the invention.

The shape of the conductors of the film carrier according to the present invention will be described. FIG. 6A is a plan view of one of conductors 200 made of copper foils. As is shown in this figure, conductor 200 consists of portions A, B, and C. Portion A will be bonded to, for example, an IC chip. Portion B connects portion A to portion C. FIG. 6B is a sectional view of conductor 200. As can be clearly shown in FIG. 6B, $h_B < h_C \leq h_A$, where $h_A$, $h_B$, and $h_C$ are the heights of portions A, B, and C, respectively. Since portion B is shorter than portions A and C, portion B does not adversely influence the bonding between portion A and the IC chip. If conductor 200 is made from a strip having a uniform thickness, and portion B has width $W_B$ less than width $W_A$ of portion A, $h_B$ will automatically become less than $h_A$ due to the undercutting when said strip is etched.

Figures 6C, 6D:
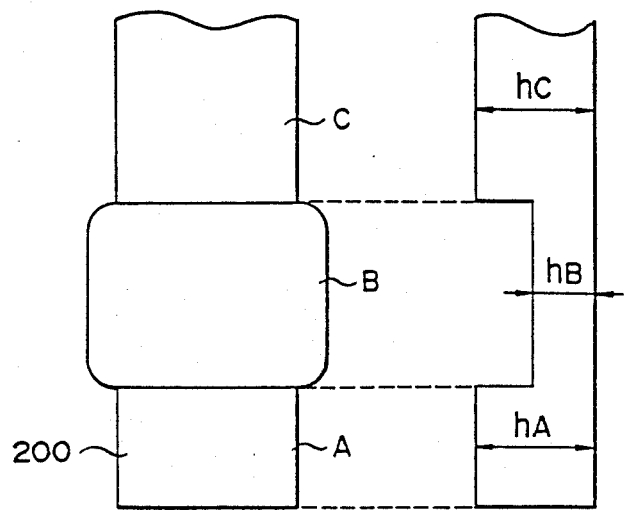

In order to make height $h_B$ of portion B less than $h_A$ and $h_C$ as is shown in FIG. 6D, portion B of a strip having a uniform width ($W_A = W_B = W_C$) can be pressed as is shown in FIG. 6C. In this case, portion B will become broader than portions A and C after it has been pressed.

In the embodiments described above, the conductors of the film carrier are bonded to the terminals of the semiconductor element in atmosphere. Instead, the bonding can be carried out in an inert-gas atmosphere. If the bonding is performed in an inert-gas atmosphere, the fine and slender conductors of the film carrier and the fine and thin terminals of the semiconductor element will be protected against oxidation.

What is claimed is:
1. A film carrier comprising:
   a base film;
   a plurality of conductors formed on the base film; and
   a plurality of layers formed on the conductors, each being made of a bonding metal having a melting point of approximately 160° C. and a softening point of approximately 134° C.
2. A film carrier according to claim 1, wherein said bonding metal comprises approximately 10 wt % of In.

* * * * *